(12) United States Patent
Yamano (10) Patent No.: US 7,795,127 B2
(45) Date of Patent: Sep. 14, 2010

(54) ELECTRONIC DEVICE MANUFACTURING METHOD AND ELECTRONIC DEVICE

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 166 days.

(21) Appl. No.: 12/140,706

(22) Filed: Jun. 17, 2008

(65) Prior Publication Data

US 2008/0315414 A1 Dec. 25, 2008

(30) Foreign Application Priority Data

Jun. 18, 2007 (JP) ............................. 2007-160613

(51) Int. Cl.
*H01L 21/44* (2006.01)

(52) U.S. Cl. .................. 438/613; 438/118; 438/459; 438/612; 438/614; 257/E23.021; 257/737

(58) Field of Classification Search .................. 438/118, 438/455, 458, 459, 612, 613, 614; 257/737, 257/738, E23.021
See application file for complete search history.

(56) References Cited

U.S. PATENT DOCUMENTS

| 6,808,962 | B2 * | 10/2004 | Tsubosaki | .................. 438/118 |
| 6,991,965 | B2 * | 1/2006 | Ono | ............................. 438/114 |
| 2002/0175409 | A1 | 11/2002 | Tsubosaki | |
| 2003/0134496 | A1 | 7/2003 | Lee et al. | |
| 2004/0115868 | A1 | 6/2004 | Ono | |
| 2004/0169287 | A1 | 9/2004 | Honda | |
| 2004/0191955 | A1 * | 9/2004 | Joshi et al. | .................. 438/106 |
| 2008/0076207 | A1 * | 3/2008 | Yamano et al. | ............. 438/108 |
| 2008/0315413 | A1 * | 12/2008 | Yamano et al. | ............. 257/737 |
| 2009/0001570 | A1 * | 1/2009 | Yamano | ..................... 257/737 |
| 2009/0127665 | A1 * | 5/2009 | Yamano et al. | ............. 257/620 |

FOREIGN PATENT DOCUMENTS

| JP | 09-064049 | 3/1997 |
| JP | 2002-031930 | 1/2002 |
| JP | 2004-006486 | 1/2004 |
| JP | 2004-047725 | 2/2004 |
| JP | 2004-193297 | 7/2004 |
| JP | 2005-158929 | 6/2005 |
| JP | 2005-353913 | 12/2005 |

* cited by examiner

*Primary Examiner*—Ha Tran T Nguyen
*Assistant Examiner*—Daniel Whalen
(74) *Attorney, Agent, or Firm*—Drinker Biddle & Reath LLP (57) ABSTRACT

There are provided the steps of forming a bump 104 having a protruded portion 104B on an electrode pad 103 formed on a substrate 101A, forming an insulating layer 105 on the substrate 101A and exposing a part of the protruded portion 104B to an upper surface of the insulating layer 105, forming a first conductive pattern 107 by using a depositing process in the upper surface of the insulating layer 105 and an exposed part of the protruded portion 104B, carrying out electrolytic plating by using the first conductive pattern 107 as a feeding layer, thereby forming a second conductive pattern 108, and patterning the second conductive pattern 108 to form a conductive pattern 106 connected to the bump 104.

5 Claims, 7 Drawing Sheets

ELECTRONIC DEVICE MANUFACTURING METHOD AND ELECTRONIC DEVICE

BACKGROUND OF THE INVENTION

The present invention relates to a method of manufacturing an electronic device and the electronic device, and more particularly, to a method of manufacturing an electronic device having a structure in which a substrate body and a conductive pattern formed thereon through an insulating layer are connected to each other by using a bump, and the electronic device.

For example, there has variously been provided an electronic apparatus in which an electrode and a conductive pattern are formed on a substrate body such as a semiconductor substrate. As one of types, a semiconductor device referred to as a chip size package has been provided.

The chip size package has a structure in which a rewiring (a conductive layer) is formed through an insulating layer (a protecting layer) on a surface of a semiconductor chip obtained by dicing a wafer to be a semiconductor substrate on which a device is formed.

In order to manufacture the chip size package, a plurality of electrodes is first formed on a semiconductor chip region of a semiconductor wafer and a bump is formed on each of the electrodes. The bump is formed through a bonding wire by using a bonding device.

Moreover, an insulating layer is formed on the semiconductor wafer having the bump formed thereon in order to protect a circuit surface formed on the wafer. In this case, a tip portion of the bump is formed to be exposed from the insulating layer.

Subsequently, a rewiring is formed on an upper part of the insulating layer by using a plating process or a printing process, for example. For a method of electrically bonding the rewiring to the bump, there has been employed a method of connecting the bump to the rewiring through pressure bonding or a method of connecting them by using a conductive paste as is disclosed in Patent Document 1.

Then, the wafer is divided into pieces through dicing so that a chip size package is formed.

[Patent Document 1] JP-A-2005-353913

In the method of bonding the bump to the rewiring through pressure bonding or a conductive paste, however, the electrical connection of the bump and the rewiring is not sufficient so that a connecting resistance is increased. In the case in which a semiconductor chip has a high speed, therefore, there is a possibility that an electrical characteristic might be deteriorated due to a high connecting impedance. In the method of bonding the bump to the rewiring through pressure bonding or a conductive paste, moreover, there is a problem in that a mechanical connecting property of the bump and the rewiring is not sufficient and a sufficient reliability might not be thus obtained.

SUMMARY OF THE INVENTION

In consideration of the respects, it is an object of the invention to provide a method of manufacturing an electronic device and the electronic device which can enhance an electrical and mechanical reliability.

In order to solve the problems, according to a first aspect of the invention, there is provided a method of manufacturing an electronic device including:

a first step of forming a bump having a protruded portion on an electrode pad formed on a substrate body;

a second step of forming an insulating layer on the substrate body and exposing a part of the protruded portion to an upper surface of the insulating layer;

a third step of forming a conductive layer by using a depositing process in the upper surface of the insulating layer and an exposed part of the protruded portion;

a fourth step of forming a wiring layer through electrolytic plating using the conductive layer as a feeding layer; and a fifth step of patterning the wiring layer to form a conductive pattern connected to the bump.

According to a second aspect of the invention, there is provided the method of manufacturing an electronic device according to the first aspect, wherein the substrate body is a semiconductor substrate.

According to a third aspect of the invention, there is provided the method of manufacturing an electronic device according to the first or second aspect, wherein the depositing process to be executed at the third step is a physical vapor deposition process.

According to a forth aspect of the invention, there is provided the method of manufacturing an electronic device according to any one of the first to third aspects, wherein at the third step, a bonding metal film such as titanium is first formed as the conductive layer, and a copper film is then formed on the bonding metal film.

According to a fifth aspect of the invention, there is provided the method of manufacturing an electronic device according to any one of the first to third aspects, wherein at the third step, a copper film is formed as the conductive layer.

According to a sixth aspect of the invention, there is provided the method of manufacturing an electronic device according to any one of the first to fifth aspects, wherein at the first step, the bump is formed through a bonding wire.

Furthermore, according to a seventh aspect of the invention, there is provided an electronic device including:

a substrate body having an electrode pad formed thereon;

a bump formed on the electrode pad;

an insulating layer formed on the substrate body; and a conductive pattern formed on the insulating layer and connected to the bump, wherein the bump and the conductive pattern are metallically bonded to each other.

According to an eighth aspect of the invention, there is provided the electronic device according to the seventh aspect, wherein the substrate body is a semiconductor chip.

According to the invention, the conductive layer is formed by using the depositing process. Therefore, it is possible to metallically bond the bump (the protruded portion) to the conductive layer. Therefore, it is possible to bring the electrical and mechanical connection of the bump and the conductive layer into an excellent state and to enhance an electrical and mechanical reliability in a bonding position of the bump and the conductive layer.

DETAILED DESCRIPTION OF THE PREFERRED EMBODIMENTS

Next, the best mode for carrying out the invention will be described with reference to the drawings.

Figure 1:
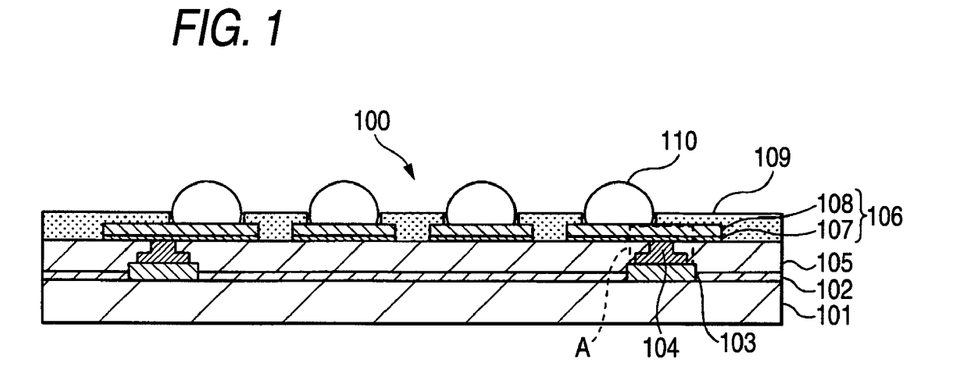
FIG. 1 is a sectional view showing a semiconductor device according to an example of the invention.

FIG. 1 shows an electronic device according to an example of the invention. In the example, description will be given by taking, as an example of the electronic device, a semiconductor device 100 (CSP) set to have a chip size.

The semiconductor device 100 according to the example has a structure in which an insulating layer 105 and a conductive pattern 106 are laminated and formed on a protecting layer (a passivation layer) 102 of a semiconductor chip 101 on which an electrode pad 103 is formed. Moreover, a bump 104 constituted by Au is formed on the electrode pad 103, for example. The bump 104 is formed through a bonding wire by using a wire bonding device, for example.

The conductive pattern 106 is referred to as a so-called rewiring in some cases and is provided to cause a position of the electrode pad 103 of the semiconductor chip 101 to be different from that of a solder bump 110 serving as an external connecting terminal (in order to carry out fan in and a terminal arrangement in an optional position). Moreover, the insulating layer 105 is constituted by an epoxy based resin, for example, and serves to protect a surface (a main surface) of the semiconductor chip 101 on which a circuit is formed and serves as a base material in the formation of the conductive pattern 106.

Figure 2:
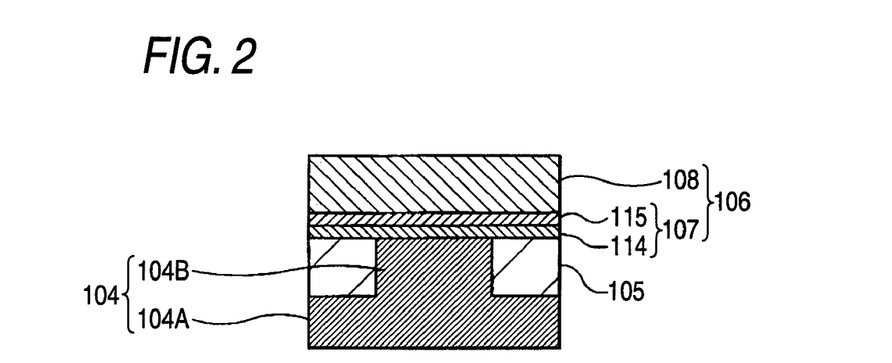
FIG. 2 is a sectional view showing the enlarged vicinity of a bump in FIG. 1.

The conductive pattern 106 has a structure in which a first conductive pattern 107 and a second conductive pattern 108 are laminated, and furthermore, the first conductive pattern 107 has a structure in which a Ti film 114 and a Cu film 115 are laminated as shown in an enlarged view of FIG. 2.

The example is characterized in that the first conductive pattern 107 (the Ti film 114, the Cu film 115) is formed by a sputtering process (a PVD process) to be a kind of depositing process. Consequently, the first conductive pattern 107 (the Ti film 114) is metallically bonded to the bump 104 (a protruded portion 104B). Thus, it is possible to enhance an electrical and mechanical connecting property of the first conductive pattern 107 and the bump 104. FIG. 2 is a view showing an enlarged region (the vicinity of the bump 104) of the semiconductor device 100 which is surrounded by a broken line indicated as A in FIG. 1.

As described above, the first conductive pattern 107 is connected to the bump 104 so that the conductive pattern 106 is connected to an electronic circuit of the semiconductor chip 101 through the bump 104. A solder resist layer (an insulating layer) 109 is formed to cover the insulating layer 105 and a part of the conductive pattern 106 around the solder bump 110.

On the other hand, the bump 104 is constituted by a bump body 104A to be bonded to the electrode pad 103 and the protruded portion 104B which is protruded from the bump body 104A as shown in FIG. 2. The bump 104 is formed by a bonding wire constituted by Au, for example, through a wire bonding device.

The wire bonding device continuously bonds the bonding wire to the electrode pad 103 and cuts the bonding wire after the bonding, thereby forming the bump body 104A to be bonded to the bump 103 and the protruded portion 104B which is protruded from the bump body 104A.

The semiconductor device 100 according to the example has a structure in which the bump 104 (more specifically, the upper surface of the protruded portion 104B) and the conductive pattern 106 (more specifically, the Ti film 114) are metallically bonded to each other as described above. In order to implement the metallic bonding, the Ti film 114 and the protruded portion 104B are bonded to each other by using a sputtering process in the example.

As in the example, the bump 104 and the conductive pattern 106 are metallically bonded to each other. Consequently, it is possible to enhance both electrical and mechanical bonding properties of the bump 104 and the conductive pattern 106. Thus, it is possible to enhance a reliability of the semiconductor device 100.

Next, a method of manufacturing the semiconductor device 100 will be described with reference to FIGS. 3A to 3M. In FIGS. 3A to 3M, corresponding structures to those shown in FIGS. 1 and 2 have the same reference numerals and description thereof will be omitted.

In order to manufacture the semiconductor device 100, first of all, a semiconductor substrate 101A (a wafer which will be hereinafter referred to as a substrate 101A) having a plurality of regions 101a (like a grid, for example) in which an electronic circuit is formed is manufactured by using a well-known method at a step shown in FIG. 3A.

The region 101a corresponds to one semiconductor chip 101. An electrode pad 103 is formed on a device forming surface 101b of the region 101a on which an electronic circuit is formed. Moreover, a protecting layer (a passivation layer) 102 formed of SiN ($Si_3N_4$) is provided in a portion other than the electrode pad 103 in the device forming surface 101b. Consequently, the device forming surface 101b is protected.

Figure 3A:
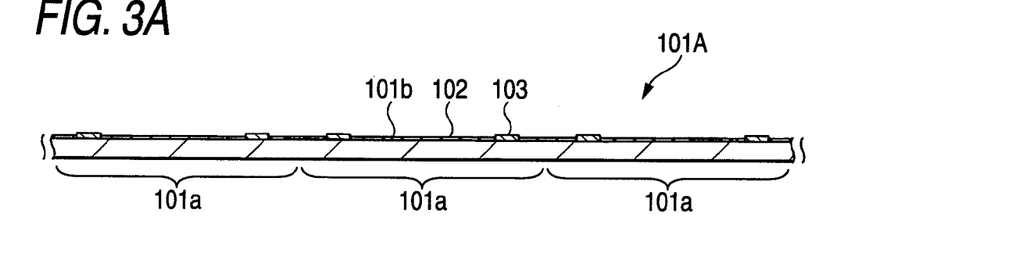
FIG. 3A is a sectional view (No. 1) for explaining a method of manufacturing a semiconductor device according to the example of the invention.
Figure 3B:
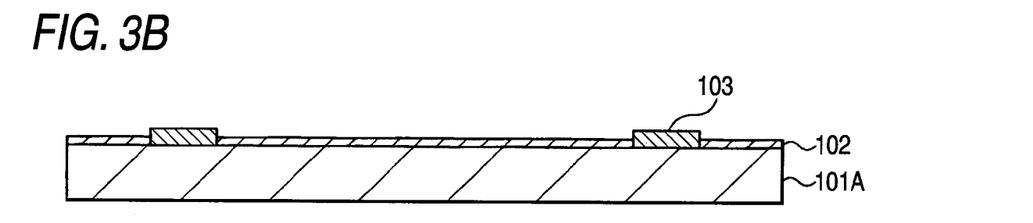
FIG. 3B is a sectional view (No. 2) for explaining the method of manufacturing a semiconductor device according to the example of the invention.

FIG. 3B shows the enlarged region 101a of the substrate 101A illustrated in FIG. 3A. In FIG. 3B and succeeding drawings, the region 101a is enlarged for convenience of illustration and explanation.

Figure 3C:
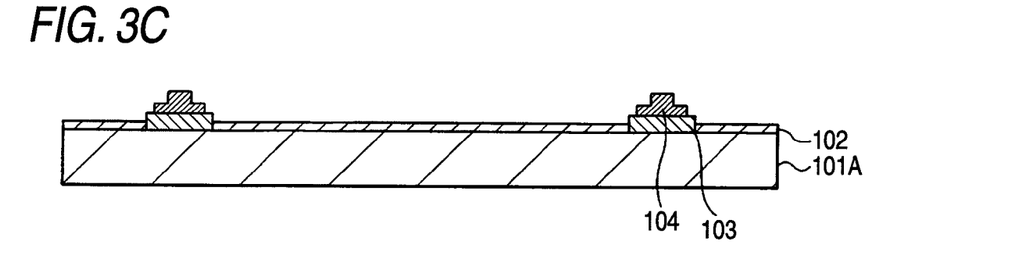
FIG. 3C is a sectional view (No. 3) for explaining the method of manufacturing a semiconductor device according to the example of the invention.

At a step shown in FIG. 3C, a bump 104 is formed on the electrode pad 103 by using a wire bonding device, for example. The bump 104 is formed through a bonding wire formed of Au. The wire bonding device continuously bonds the bonding wire to the electrode pad 103 and cuts the bonding wire after the bonding, thereby forming a bump body 104 to be bonded to the electrode pad 103 and a protruded portion 104B which is protruded from the bump body 104A.

Figure 3D:
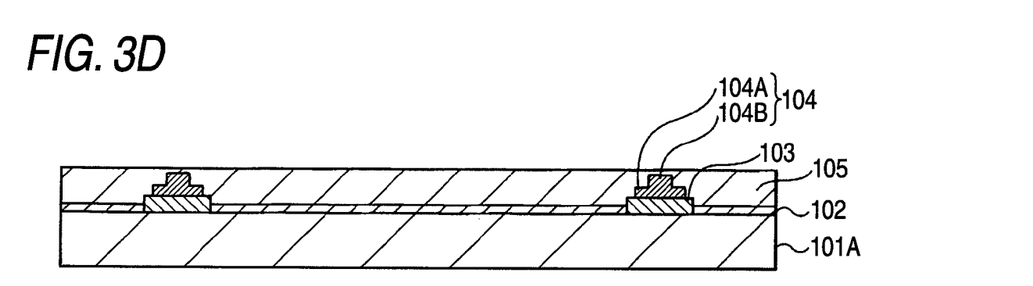
FIG. 3D is a sectional view (No. 4) for explaining the method of manufacturing a semiconductor device according to the example of the invention.

At a step shown in FIG. 3D, next, an insulating layer 105 formed by an epoxy based resin material, for example, is laminated (stuck) onto the substrate 101A (the protecting layer 102). For the insulating layer 105, it is preferable to use a soft resin material to which a hardness regulating material such as a filler referred to as NCF is rarely added, for example. In a state in which the insulating layer 105 is disposed, the bump 104 is positioned in the insulating layer 105. However, a tip of the protruded portion 104B does not need to be exposed from an upper surface of the insulating layer 105.

Figure 3E:
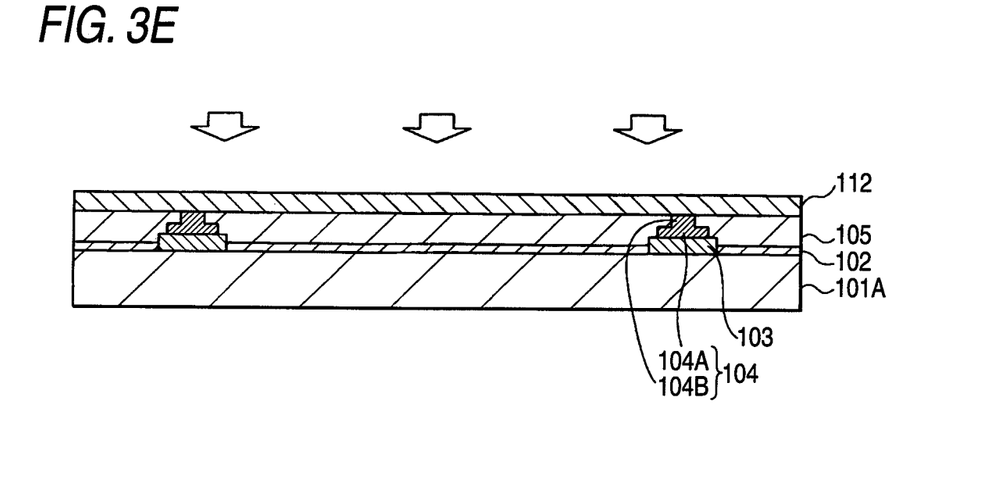
FIG. 3E is a sectional view (No. 5) for explaining the method of manufacturing a semiconductor device according to the example of the invention.

Next, a copper foil 112 is provided on the insulating layer 105 and a pressure bonding treatment is carried out as shown in FIG. 3E. Consequently, the insulating layer 105 is also pressed so that a part of the protruded portion 104B in the bump 104 is exposed from an upper surface of the insulating layer 105.

In this case, the NCF to be the insulating layer 105 is a soft resin material. Therefore, it is possible to reliably expose the protruded portion 104B from the insulating layer 105. Moreover, a thickness of the insulating layer 105 is also selected in such a manner that the protruded portion 104B is reliably protruded from the upper surface of the insulating layer 105 in the pressure bonding treatment. By the pressure bonding treatment, furthermore, the protruded portion 104B of the bump 104 is pressed by the copper foil 112 and a height of a tip portion thereof is made uniform (leveling).

The copper foil 112 to be used in this case has a rough surface at an opposed side to the insulating layer 105. For this reason, the rough surface of the copper foil 112 is maintained to be transferred to a surface of the insulating layer 105 to which the copper foil 112 is pressure bonded (which will be described below).

A material of the insulating layer 105 is not restricted to the NCF but various insulating materials (resin materials) can be used. For example, it is also possible to use, as the insulating layer 105, a buildup resin (an epoxy resin containing a filler) or a resin material referred to as ACF. Moreover, a layer to be formed on the insulating layer 105 does not always need to be the copper foil 112 but a temporary film formed of PET can also be used. Furthermore, it is also possible to use a resin film having a single surface coated with a copper foil in which a Cu foil is previously provided on a single side of a resin film.

Figure 3F:
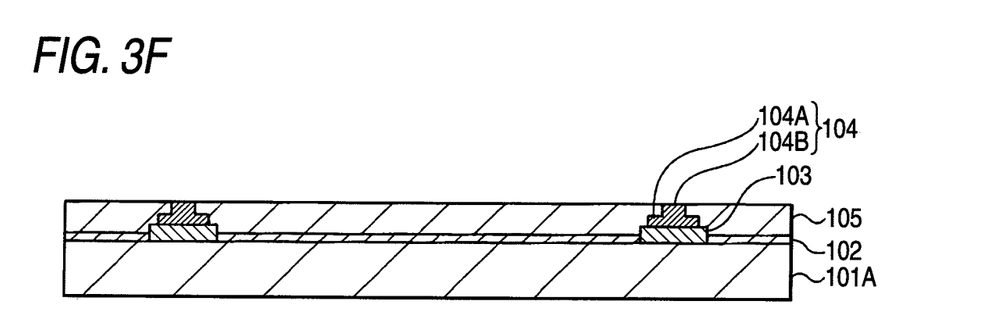
FIG. 3F is a sectional view (No. 6) for explaining the method of manufacturing a semiconductor device according to the example of the invention.

When the pressure bonding treatment is ended, for example, the copper foil 112 is removed by using an etching process, for example. FIG. 3F shows a state in which the copper foil 112 is removed. As described above, the protruded portion 104B is exposed from the insulating layer 105 and is subjected to leveling in the pressure bonding treatment. In the state in which the copper foil 112 is removed, therefore, the protruded portion 104B is exposed from the insulating layer 105.

Figure 3G:
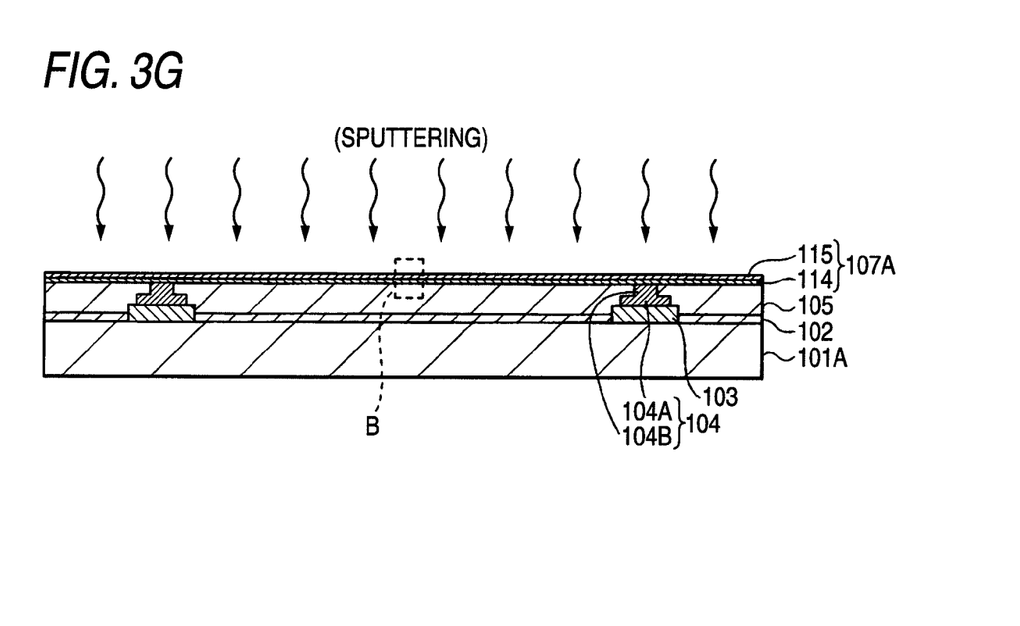
FIG. 3G is a sectional view (No. 7) for explaining the method of manufacturing a semiconductor device according to the example of the invention.

At a step shown in FIG. 3G, next, a first conductive layer 107A is formed on the upper surfaces of the insulating layer 105 and the bump body 104A. The example is characterized in that the first conductive layer 107A (the first conductive pattern 107) is formed by using a sputtering process to be a kind of depositing process.

The first conductive layer 107A has a structure in which a Ti film 114 and a Cu film 115 are laminated. Therefore, sputtering is first carried out by using Ti as a target to form the Ti film 114, and subsequently, the sputtering is carried out by using Cu as a target to form the Cu film 115 in order to form the first conductive layer 107A on the insulating layer 105. The Ti film 114 and the Cu film 115 can be continuously formed by using an identical sputtering device.

Figure 3H:
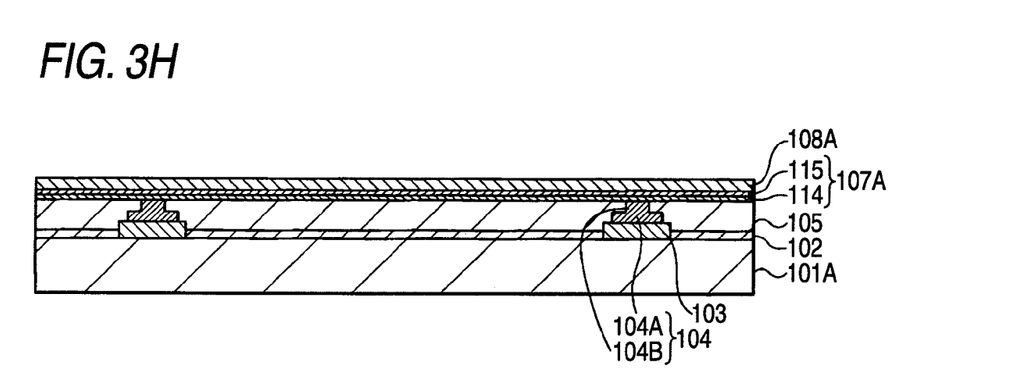
FIG. 3H is a sectional view (No. 8) for explaining the method of manufacturing a semiconductor device according to the example of the invention.

In the example, moreover, a thickness of the Ti film 114 is set to be 0.1 µm and a thickness of the Cu film 115 is set to be 1.0 µm (in FIGS. 3G and 3H, the Ti film 114 and the Cu film 115 are exaggeratedly drawn to be thicker than the other layers for convenience of illustration). Referring to the Ti film 114, however, the thickness and the material are not restricted. For example, it is also possible to use a Cr film having a thickness of 0.035 µm in place of the Ti film 114. Furthermore, it is also possible to carry out the sputtering by using Cu as a target, thereby causing the first conductive pattern 107 to have a single layer structure of the Cu film without setting the first conductive pattern 107 to have the lamination structure of the Ti film 114 and the Cu film 115.

In the example, the conductive layer 107A (the Ti film 114, the Cu film 115) is formed by using the sputtering process as described above. For this reason, the protruded portion 104B exposed from the insulating layer 105 and the Ti film 114 are metallically bonded to each other (in the case in which the conductive layer 107A is set to have the single layer structure of the Cu film, the protruded portion 104B and the Cu film are metallically bonded to each other). Moreover, the Cu film 115 is also formed on the Ti film 114 by using the sputtering process. Therefore, the Ti film 114 and the Cu film 115 are also bonded metallically.

As compared with the bonding method using pressure bonding or a conductive paste according to the conventional art, accordingly, it is possible to bond the bump 104 to the conductive layer 107A more strongly and to enhance their mechanical and electrical connecting properties more greatly.

In the example, the conductive layer 107A (the Ti film 114) is provided on the upper surface of the insulating layer 105 to be the resin through the sputtering. For this reason, there is an apprehension of the bonding property of the insulating layer 105 and the first conductive pattern 107. In the example, however, the copper foil 112 having the single side roughened is used as described above. Consequently, the rough surface of the copper foil 112 is transferred to the surface of the insulating layer 105 in a state in which the copper foil 112 is removed (see FIG. 3F). In other words, as shown in an enlarged view of FIG. 4, a rough surface 105A is formed on the surface of the insulating layer 105 in the state in which the copper foil 112 is removed.

Figure 4:
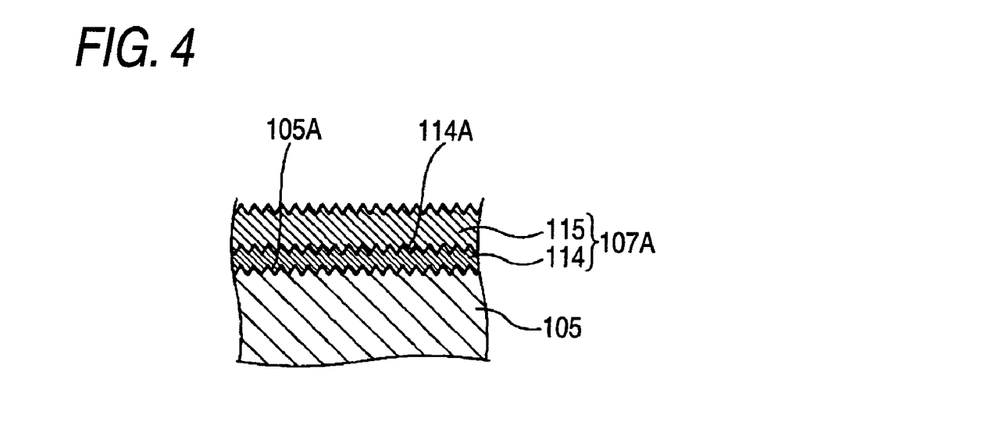
FIG. 4 is a sectional view showing the enlarged vicinity of a Ti film and a Cu film in FIG. 3G.

Accordingly, the Ti film 114 is provided on the insulating layer 105 having the rough surface 105A formed thereon through the sputtering process. Consequently, the Ti film 114 is brought into such a state as to cut into concavo-convex portions of the rough surface 105A so that a so-called anchor effect is generated between the insulating layer 105 and the Ti film 114. Even if the insulating layer 105 is a resin, consequently, the Ti film 114 can be reliably formed on the insulating layer 105. Therefore, it is possible to prevent peeling of the Ti film 114 from the insulating layer 105, thereby enhancing the reliability of the semiconductor device 100.

As shown in FIG. 4, moreover, the rough surface 105A of the insulating layer 105 is also transferred to a surface 114A of the Ti film 114 formed thereon so that the surface 114A also becomes a rough surface. Therefore, the anchor effect is also generated between the surface 114A and the Cu film 115 formed thereon so that the bonding property of the Ti film 114 and the Cu film 115 can be enhanced. FIG. 4 is a view showing an enlarged region surrounded by a broken line indicated as B in FIG. 3G.

Figure 3I:
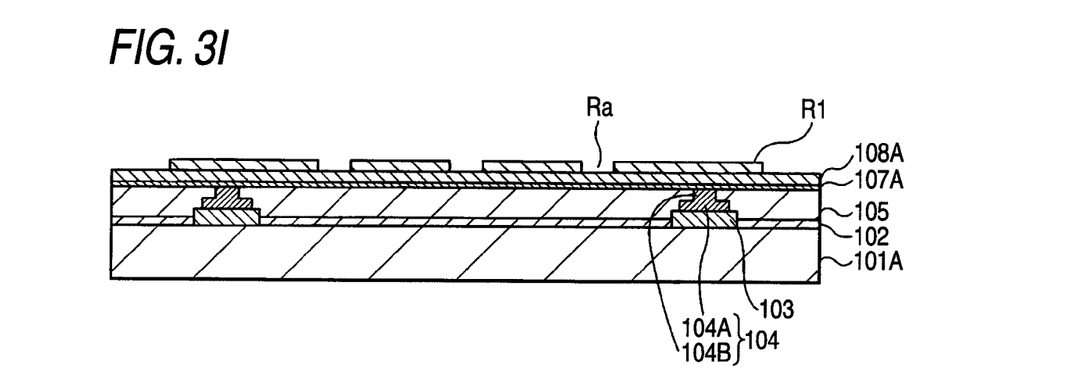
FIG. 3I is a sectional view (No. 9) for explaining the method of manufacturing a semiconductor device according to the example of the invention.
Figure 3J:
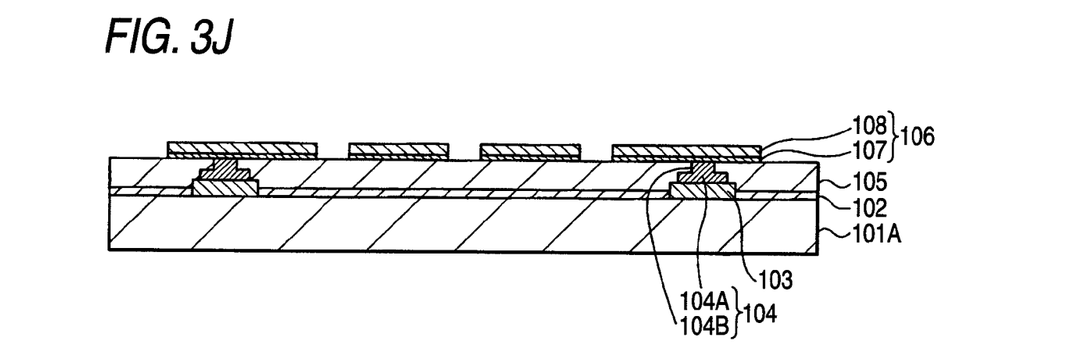
FIG. 3J is a sectional view (No. 10) for explaining the method of manufacturing a semiconductor device according to the example of the invention.

At steps shown in FIGS. 3H to 3J, next, a conductive pattern 106 to be connected to the bump 104 is formed through electrolytic plating using the conductive layer 107A as a feeding layer (a seed layer). A method of forming the conductive pattern 106 includes so-called subtractive and semiadditive processes, for instance. In the example, description will be given to an example in which the subtractive process is used.

At the step shown in FIG. 3H, first of all, a conductive layer 108A formed of Cu, for example, is laminated on the conductive layer 107A through the electrolytic plating using the conductive layer 107A (the Ti film 114, the Cu film 115) as the feeding layer. At the step shown in FIG. 3I, next, a mask pattern R1 having an opening portion Ra is formed on the conductive layer 108A. The mask pattern R1 can be formed by forming a resist layer through an application or sticking of a film and patterning the resist layer using a photolithographic process.

At the step shown in FIG. 3J, then, the conductive layers 107A and 108A are subjected to pattern etching using the mask pattern R1 as a mask. Consequently, a first conductive layer 107 and a second conductive layer 108 are laminated, and a conductive pattern 106 connected to the bump 104 is formed.

For example, the first conductive pattern 107 is formed to have a thickness of approximately 1 to 2 µm and the second conductive pattern 108 is formed to have a thickness of approximately 10 to 30 µm, and the numeric values are only illustrative and the invention is not restricted to the numeric values.

In order to form the conductive pattern 106, it is easy to use the electrolytic plating process by setting the conductive layer 107A to be the feeding layer. In the case in which the feeding layer (seed layer) is formed through a nonelectrolytic plating process, for example, it is necessary to carry out a treatment for roughening a surface of an insulating layer (a so-called desmear treatment). Thus, a treatment for forming a plated layer is complicated.

On the other hand, in the method according to the example, the desmear treatment is not required. Consequently, it is possible to easily form the feeding layer (the conductive layer 107A) by a simple method. According to the method, therefore, a method of manufacturing a semiconductor device is simplified so that a manufacturing cost is reduced.

Figure 3K:
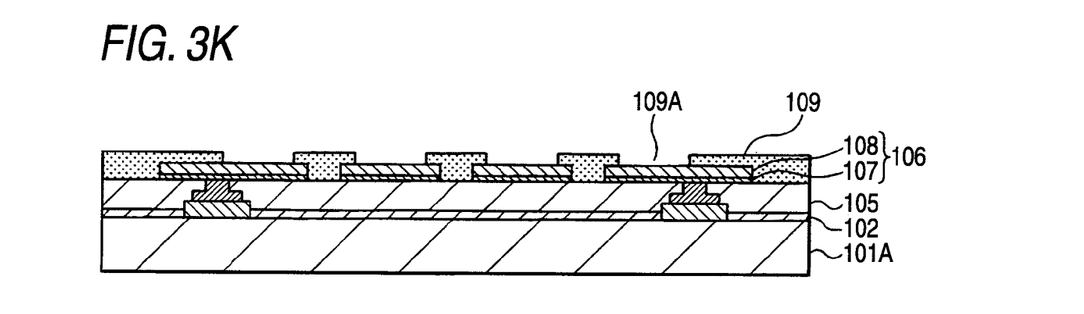
FIG. 3K is a sectional view (No. 11) for explaining the method of manufacturing a semiconductor device according to the example of the invention.

At a step shown in FIG. 3K, thereafter, a roughening treatment is carried out over a surface of the conductive pattern 106 (Cu) if necessary, and a solder resist layer (an insulating layer) 109 having an opening portion 109A is then formed on the insulating layer 105. A part of the conductive pattern 106 is exposed from the opening portion 109A.

Figure 3L:
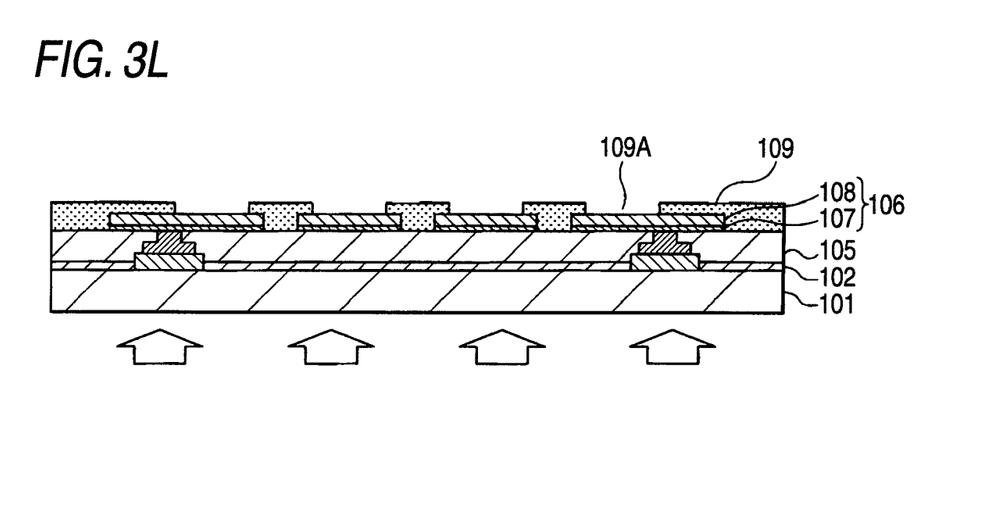
FIG. 3L is a sectional view (No. 12) for explaining the method of manufacturing a semiconductor device according to the example of the invention.

At a step shown in FIG. 3L, subsequently, back grinding is carried out over the substrate 101A if necessary, thereby causing the substrate 101A to have a certain thickness.

Figure 3M:
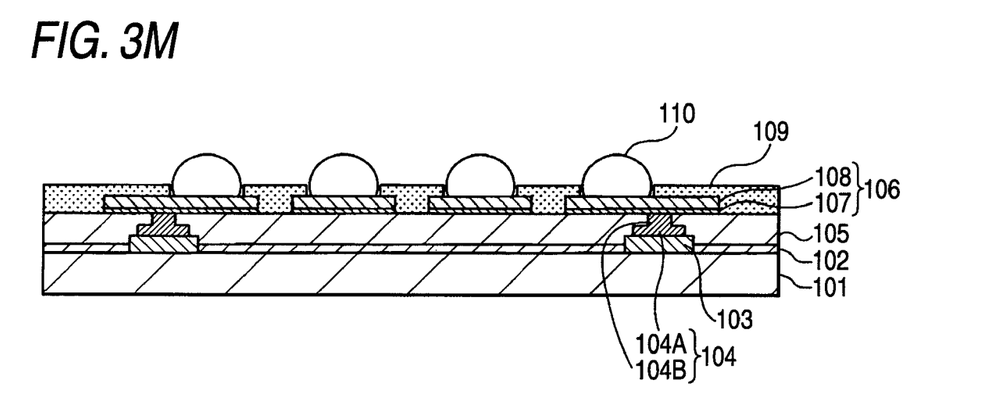
FIG. 3M is a sectional view (No. 13) for explaining the method of manufacturing a semiconductor device according to the example of the invention.

At a step shown in FIG. 3M, subsequently, a solder bump 110 is formed on the conductive pattern 106 exposed from the opening portion 109A if necessary. Furthermore, the substrate 101A is subjected to dicing to divide the semiconductor chip into pieces. Consequently, it is possible to manufacture the semiconductor device 100 shown in FIG. 1.

While the conductive pattern 106 is formed by the subtractive process in the manufacturing method, it may be formed by using the semiadditive process. In this case, for example, it is preferable to execute the steps shown in FIGS. 3A to 3G in the manufacturing method and to then carry out steps which will be described below in place of the steps shown in FIGS. 3H to 3J.

Figure 5:
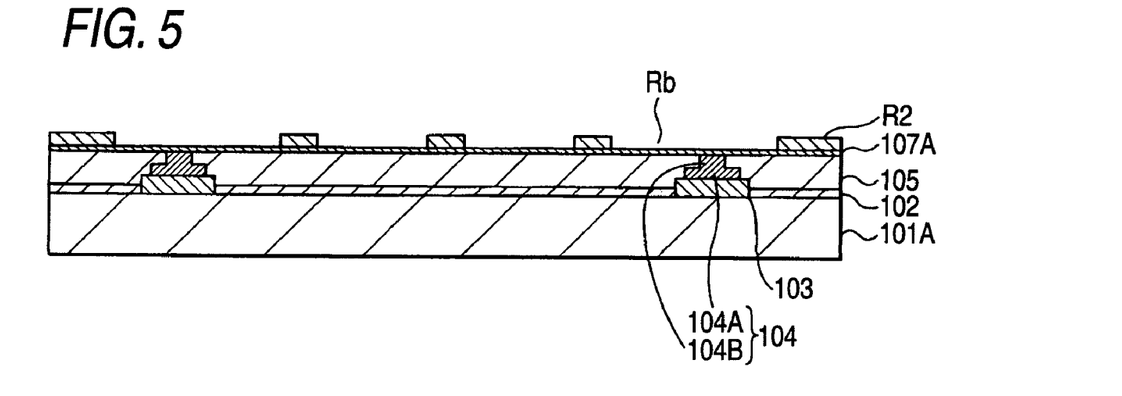
FIG. 5 is a sectional view for explaining a variant of the method of manufacturing a semiconductor device according to the example of the invention.

More specifically, as shown in FIG. 5, a mask pattern R2 having an opening portion Rb is formed on a conductive layer 107A. The mask pattern R2 can be formed by forming a resist layer through an application or sticking of a film and patterning the resist layer using a photolithographic process.

Next, electrolytic plating using the conductive layer 107A as a feeding layer (a seed layer) is executed to form a second conductive pattern on the conductive layer 107A exposed from the opening portion Rb. Then, the mask pattern R2 is peeled, and furthermore, the excessive feeding layer 107A exposed by peeling the mask pattern R2 is removed by etching. Consequently, it is possible to form the conductive pattern 106 shown in FIG. 3J.

While the invention is described above based on the preferred examples, the invention is not restricted to the specific examples but various modifications and changes can be made without departing from the gist described in the claims.

More specifically, it is also possible to use a glass substrate or a multilayer wiring board for the substrate 101A in place of the semiconductor substrate. Accordingly, it is possible to carry out an application to various electronic devices using the substrates.

Moreover, the depositing process is not restricted to the sputtering process but a vacuum deposition process or a physical vapor deposition process such as ion plating can also be used, and furthermore, a chemical vapor deposition process such as a CVD process can be used.

What is claimed is:

1. A method of manufacturing an electronic device comprising:
    a first step of forming a bump having a protruded portion on an electrode pad formed on a substrate body;
    a second step of forming an insulating layer on the substrate body and the protruded portion, providing on the insulating layer with a copper foil of which surface at an opposed side to the insulating layer is a rough surface, exposing a part of the protruded portion to an upper surface of the insulating layer by pressure bonding the copper foil onto the insulating layer, transferring the rough surface to the insulating layer and the part of the protruded portion exposed from the insulating layer, and then removing the copper foil;
    a third step of forming a conductive layer by firstly forming a Ti film in the upper surface of the insulating layer to which the rough surface is transferred and an exposed part of the protruded portion by using a depositing process, and then by forming a copper film on an upper surface of the Ti film by using the depositing process;
    a fourth step of forming a wiring layer through electrolytic plating using the conductive layer as a feeding layer; and
    a fifth step of patterning the wiring layer to form a conductive pattern connected to the bump.

2. The method of manufacturing an electronic device according to claim 1, wherein
    the substrate body is a semiconductor substrate.

3. The method of manufacturing an electronic device according to claim 1, wherein
    the depositing process to be executed at the third step is a physical vapor deposition process.

4. The method of manufacturing an electronic device according to claim 1, wherein
at the third step, a bonding metal film is first formed as the conductive layer, and a copper film is then formed on the bonding metal film.

5. The method of manufacturing an electronic device according to claim 1, wherein
at the first step, the bump is formed through a bonding wire.

* * * * *